(12) United States Patent
Kim et al.

(10) Patent No.: US 7,586,137 B2
(45) Date of Patent: Sep. 8, 2009

(54) NON-VOLATILE MEMORY DEVICE AND METHOD OF FABRICATING THE SAME

(75) Inventors: Ki-chul Kim, Suwon-si (KR);
Geum-jong Bae, Incheon (KR);
In-wook Cho, Yongin-si (KR);
Byoung-jin Lee, Seoul (KR); Sang-su Kim, Suwon-si (KR); Jin-hee Kim, Seongnam-si (KR); Byou-ree Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 284 days.

(21) Appl. No.: 11/200,491

(22) Filed: Aug. 9, 2005

(65) Prior Publication Data

US 2006/0027854 A1 Feb. 9, 2006

(30) Foreign Application Priority Data

Aug. 9, 2004 (KR) ............... 10-2004-0062486
Dec. 18, 2004 (KR) ............... 10-2004-0108429

(51) Int. Cl.
*H01L 29/76* (2006.01)
(52) U.S. Cl. ............... 257/287; 257/219; 257/221; 257/241; 257/285; 257/404; 257/324; 257/E29.056
(58) Field of Classification Search ............... 257/324, 257/E29.309, 219, 221, 241, 285, 287, 404, 257/E29.056
See application file for complete search history.

(56) References Cited

U.S. PATENT DOCUMENTS 7,087,955 B2 * 8/2006 Kawashima et al. ........ 257/316

2004/0080012 A1 4/2004 Kim ........................ 257/492

FOREIGN PATENT DOCUMENTS

| JP | 2000-004014 | 1/2000 |
| JP | 2004-153247 | 5/2004 |
| KR | 10-2003-0094497 | 12/2003 |
| KR | 10-2004-0023294 | 3/2004 |
| KR | 10-2004-0072340 | 8/2004 |

\* cited by examiner

*Primary Examiner*—Eugene Lee
(74) *Attorney, Agent, or Firm*—Mills & Onello, LLP.

(57) ABSTRACT

A non-volatile memory device having an asymmetric channel structure is provided. The non-volatile memory device includes a semiconductor substrate, a source region and a drain region which are formed in the semiconductor substrate and doped with n-type impurities, a trapping structure which includes a tunneling layer, which is disposed on a predetermined region of the semiconductor substrate and through which charge carriers are tunneled, and a charge trapping layer, which is formed on the tunneling layer and traps the tunneled charge carriers, a gate insulating layer which is formed on the trapping structure and the exposed semiconductor substrate, a gate electrode which is formed on the gate insulating layer, and a channel region which is formed between the source region and the drain region and includes a first channel region formed on a lower part of the trapping structure and a second channel region formed on a lower part of the gate insulating layer, the threshold voltage of the first channel region being lower than that of the second channel region.

28 Claims, 17 Drawing Sheets

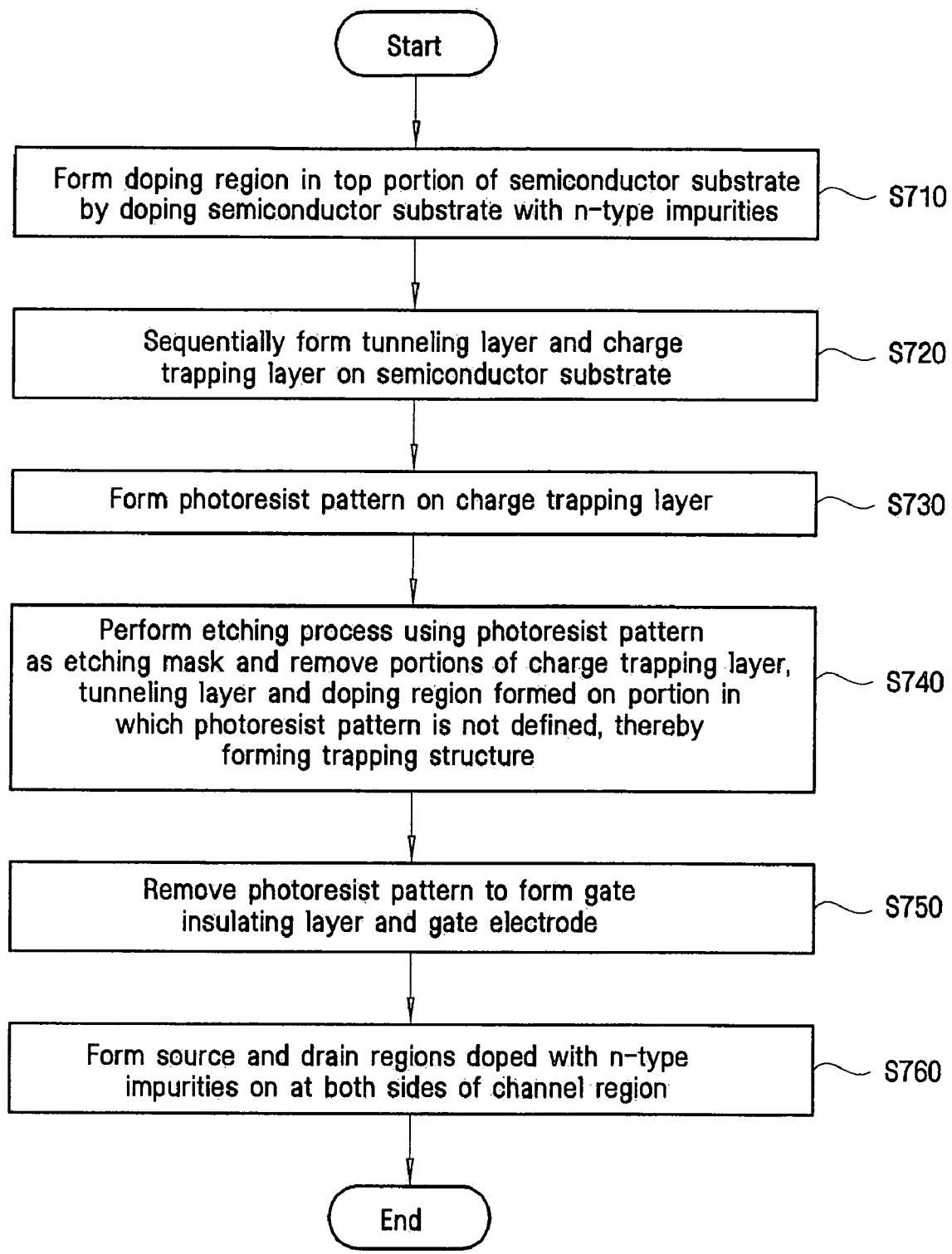

NON-VOLATILE MEMORY DEVICE AND METHOD OF FABRICATING THE SAME

This application claims priority from Korean Patent Application Nos. 10-2004-0062486 and 10-2004-0108429 filed on Aug. 9, 2004 and Dec. 18, 2004, respectively in the Korean Intellectual Property Office, the contents of which are incorporated herein in their entireties by reference

BACKGROUND OF THE INVENTION

1. Field of the Invention

The present invention relates to a non-volatile memory device and a method of fabricating the same, and more particularly, to a non-volatile memory device having an asymmetric channel structure and a method of fabricating the same.

2. Description of the Related Art

Semiconductor memory devices that are used for storing data are generally categorized as volatile memory devices and non-volatile memory devices.

Volatile memory devices lose their stored data when supplied power is interrupted, while non-volatile memory devices retain their stored data even when the power supply is interrupted.

Thus, non-volatile memory devices are widely used in situations where power is not always available or frequently interrupted, and when low power usage is required, such as in mobile telecommunication systems, memory cards for storing music and/or image data, and in other applications.

Conventionally, floating gate type non-volatile memory devices have been typically used. However, recently, non-volatile memory devices having an Oxide-Nitride-Oxide (ONO) structure have been gaining importance. Such devices can reduce the vertical thicknesses of the non-volatile memory devices and improve the integration density because they have a driving method similar to the floating gate type non-volatile memory devices and charge carriers are stored using a nitride layer as a charge storing layer instead of a floating gate formed of a polysilicon film. Among the different types of ONO non-volatile memory devices, local ONO non-volatile memory devices having a form in which a nitride layer functioning as a charge trapping layer is distributed in only a partial region have been extensively studied.

FIG. 1 is a cross-sectional view illustrating programming and erasing operations of a conventional local ONO non-volatile memory device.

Referring to FIG. 1, a conventional local ONO non-volatile memory device 10 includes a semiconductor substrate 100, a source region 110, a drain region 120, a tunneling layer 130, a charge trapping layer 140, a gate insulating layer 150 and a gate electrode 160 which are formed on the semiconductor substrate 100.

The local ONO non-volatile memory device 10 has a structure which can be programmed by hot electron injection.

If a positive voltage is applied to the gate electrode 160 and an appropriate voltage is applied to the source region 110 and the drain region 120, hot electrons from the semiconductor substrate 100 pass through the tunneling layer 130 and are then trapped by the charge trapping layer 140 (a region where the hot electrons are trapped is indicated as a region A of FIG. 1). This is referred to as a programming operation of the charge trapping layer 140.

If a negative voltage is applied to the gate electrode 160 and an appropriate voltage is applied to the source region 110 and the drain region 120, hot holes from the semiconductor substrate 100 are trapped by the charge trapping layer 140. The hot holes combine with the hot electrons which are previously trapped by the charge trapping layer 140, thereby electrically neutralizing the charge trapping layer 140. This is referred to as an erasing operation of the programmed charge trapping layer 140.

However, when performing the erasing operation, the hot holes are actually distributed in only a region B shown in FIG. 1 by an electromagnetic effect. Accordingly, the erasing operation is not completely performed in a region C of an electron trapping region (referred to as the region A).

As a result, as the number of times the programming and erasing operations are performed increases, the range of the region C where the erasing operation is not performed is increased and the range of the region B where the erasing operation is performed is decreased.

Generally, if the hot electrons are trapped by the charge trapping layer 140, the threshold voltage (Vth) is increased by a shielding effect. However, if the range of a region (the region C) where the hot electrons are not erased is increased as the number of times the programming and erasing operations are performed increases, the characteristics of the programming and erasing operations of the local ONO non-volatile memory device are degraded.

SUMMARY OF THE INVENTION

The present invention provides a non-volatile memory device in which the characteristics of programming and erasing operations are not degraded even if the programming and erasing operations are performed a large number of times.

The present invention also provides a method for fabricating a non-volatile memory device in which characteristics of programming and erasing operations are not degraded even if the programming and erasing operations are performed a large number of times.

According to an aspect of the present invention, there is provided a non-volatile memory device including a semiconductor substrate, a source region and a drain region which are formed in the semiconductor substrate and doped with n-type impurities, a trapping structure which includes a tunneling layer, which is disposed on a predetermined region of the semiconductor substrate and through which charge carriers are tunneled, and a charge trapping layer, which is formed on the tunneling layer and traps the tunneled charge carriers, a gate insulating layer which is formed on the trapping structure and the exposed semiconductor substrate, a gate electrode which is formed on the gate insulating layer, and a channel region which is formed between the source region and the drain region and includes a first channel region formed on a lower part of the trapping structure and a second channel region formed on a lower part of the gate insulating layer, the threshold voltage of the first channel region being lower than that of the second channel region.

According to another aspect of the present invention, there is provided a non-volatile memory device including a semiconductor substrate, a source region and a drain region which are formed in the semiconductor substrate and doped with n-type impurities, a trapping structure which includes a tunneling layer, which is disposed on a predetermined region of the semiconductor substrate and through which charge carriers are tunneled, and a charge trapping layer, which is formed on the tunneling layer and traps the tunneled charge carriers, a gate insulating layer which is formed on the trapping structure and the exposed semiconductor substrate, a gate electrode which is formed on the gate insulating layer, a channel region, which is formed between the source region and the drain region when a threshold voltage is applied to the gate electrode, and includes a first channel region on a lower part of the trapping structure and a second channel region on a lower part of the gate insulating layer, a first doping region which is formed at a predetermined location in the first channel region, and a second doping region which is formed at a predetermined location in the second channel region, the threshold voltage of the first doping region being lower than that of the second doping region.

According to still another aspect of the present invention, there is provided a non-volatile memory device including a semiconductor substrate which has a mesa-typed doping region doped with n-type impurities, a source region and a drain region which are formed in the semiconductor substrate and doped with n-type impurities, a trapping structure which includes a tunneling layer, which is formed on the mesa-typed doping region and through which charge carriers are tunneled, and a charge trapping layer, which is formed on the tunneling layer and traps the tunneled charge carriers, a gate insulating layer which is formed on the trapping structure and the exposed semiconductor substrate, a gate electrode which is formed on the gate insulating layer, a channel region, which is formed between the source region and the drain region when a threshold voltage is applied to the gate electrode and includes a first channel region on a lower part of the mesa-typed doping region and a second channel region on a lower part of the gate insulating layer, the threshold voltage of the first channel region being lower than that of the second channel region.

According to yet another aspect of the present invention, there is provided a method of fabricating a non-volatile memory device including forming a tunneling layer which is formed on a semiconductor substrate and through which charge carriers are tunneled, and a charge trapping layer which is formed on the tunneling layer and traps the tunneled charge carriers, forming a channel region including a first channel region which is formed on a lower part of the tunneling layer and a second channel region which is formed on the lower part of the tunneling layer to be adjacent to the first channel region and has the threshold voltage higher than that of the first channel region, removing the tunneling layer and the charge trapping layer formed on an upper part of the second channel region to form a trapping structure, forming a gate insulating layer on the trapping structure and the semiconductor substrate of the upper part of the second channel region, forming a gate electrode on the gate insulating layer, and forming a source region at one side of the channel region and a drain region at the other side of the channel region by doping the semiconductor substrate with n-type impurities.

According to a further aspect of the present invention, there is provided a method of fabricating a non-volatile memory device including forming a tunneling layer which is formed on a semiconductor substrate and through which charge carriers are tunneled, and a charge trapping layer which is formed on the tunneling layer and traps the tunneled charge carriers, forming a channel region including a first channel region which is formed on a lower part of the tunneling layer and a second channel region which is formed on the lower part of the tunneling layer to be adjacent to the first channel region and has the threshold voltage lower than that of the first channel region, removing the tunneling layer and the charge trapping layer formed on an upper part of the second channel region to form a trapping structure, forming a gate insulating layer on the trapping structure and the semiconductor substrate of the upper part of the second channel region, forming a gate electrode on the gate insulating layer, and forming a source region at one side of the channel region and a drain region at the other side of the channel region by doping the semiconductor substrate with p-type impurities.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 7 is a process flow chart illustrating a method of fabricating the non-volatile memory device according to the second embodiment of the present invention.

DETAILED DESCRIPTION OF THE INVENTION

Figure 2:
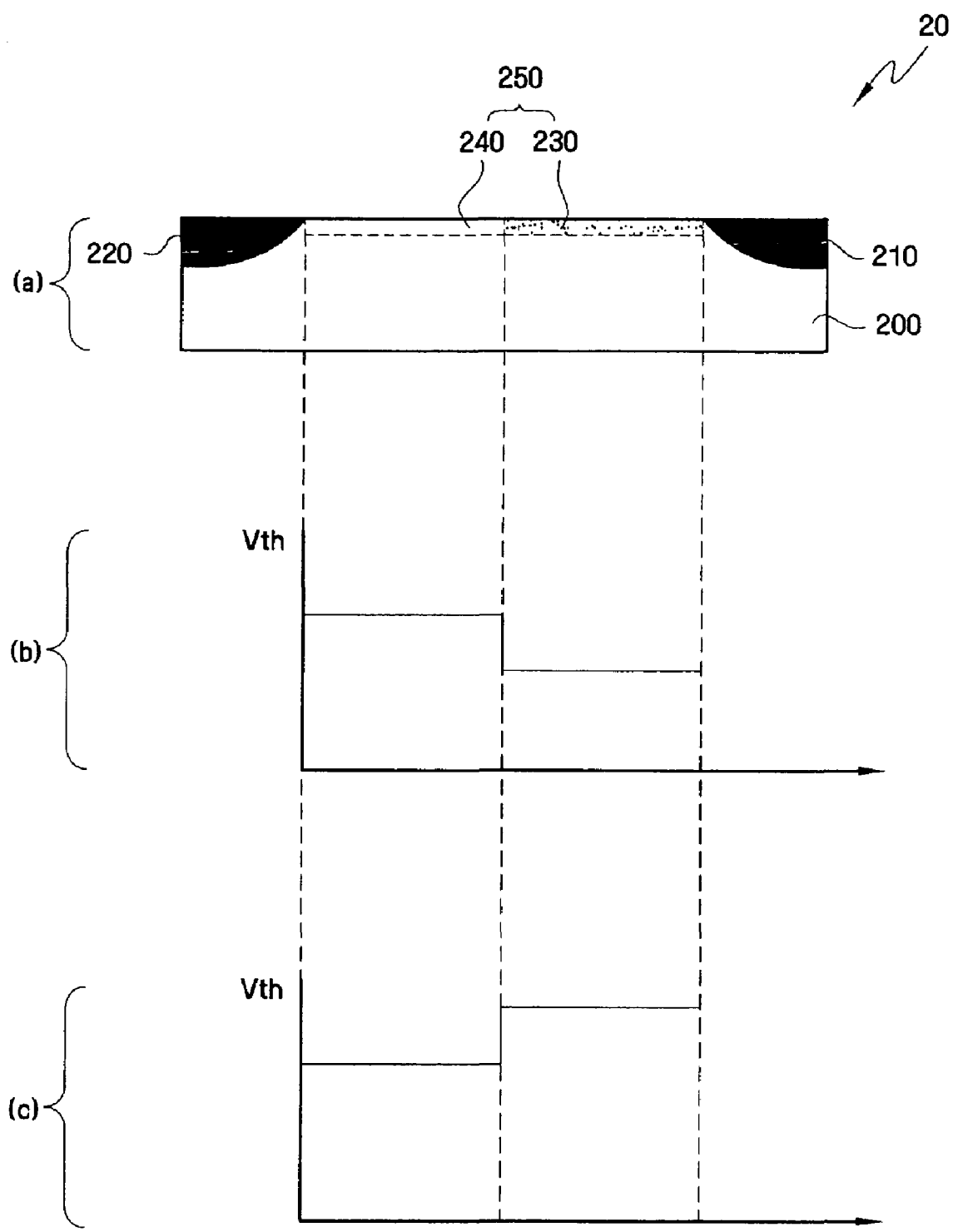
FIG. 2 contains a cross-sectional view of a semiconductor device having an asymmetric channel structure according to the present invention and graphs illustrating the relative size of the threshold voltage with respect to a longitudinal direction of the semiconductor device.

FIG. 2 contains a cross-sectional view, labeled (a), of a semiconductor device having an asymmetric channel structure according to the present invention. Graphs labeled (b) and (c) are graphs illustrating the relative size of the threshold voltage with respect to the longitudinal direction of the semiconductor device labeled (a).

Referring to (a) in FIG. 2, a semiconductor device 20 having an asymmetric channel structure includes a source region 210 and a drain region 220 which are obtained by doping a semiconductor substrate 200 with first conductivity type impurities, and a channel region 250 formed between the source region 210 and the drain region 220.

The channel region 250 is comprised of a first channel region 230 adjacent to one of the source region 210 and the drain region 220 and a second channel region 240 in the remaining part of the channel region 250 where the first channel region is not formed.

The first channel region 230 is doped with the first conductivity type impurities and the second channel region 240 is doped with second conductivity type impurities.

Here, in a case where the first conductivity type is n-type, the second conductivity type is p-type. A group V element, that is, one or more of the elements N, P, As, Sb and Bi, can be used as the first conductivity type impurities. A group III element, that is, one or more of the elements B, Al, Ga and In, can be used as the second conductivity type impurities.

Further, if the first conductivity type is p-type and the second conductivity type is n-type, a group III element is used as the first conductivity type impurities and a group V element is used as the second conductivity type impurities.

Referring to (b) in FIG. 2, in a case where the source region 210 and the drain region 220 are doped with n-type impurities, when the first channel region 230 is doped with n-type impurities and the second channel region 240 is doped with p-type impurities, the threshold voltage of the first channel region 230 is lower than the threshold voltage of the second channel region 240. Further, even if the first channel region 230 and the second channel region 240 are doped with the same conductivity type of impurities, for example, n-type impurities, when a doping concentration of the first channel region 230 is higher than that of the second channel region 240, the threshold voltage of the first channel region 230 will be lower than that of the second channel region 240.

That is, the size of the threshold voltages of the first and second channel regions 230 and 240 can each be controlled by adjusting the conductivity type and the concentration of the doping impurities of the channel region 250.

Referring to (c) in FIG. 2, if the first channel region 230 is doped with impurities of a different conductivity type to that of the impurities for doping the source and drain regions 210 and 220 and the concentration of the conductivity type impurities of the first channel region 230 is higher than that of the second channel region 240, the threshold voltage of the first channel region 230 is higher than that of the second channel region 240.

The above-described semiconductor device 20 of the asymmetric channel structure can be mainly utilized in non-volatile memory devices, in particular, local Oxide-Nitride-Oxide (ONO) non-volatile memory devices.

Figure 3A:
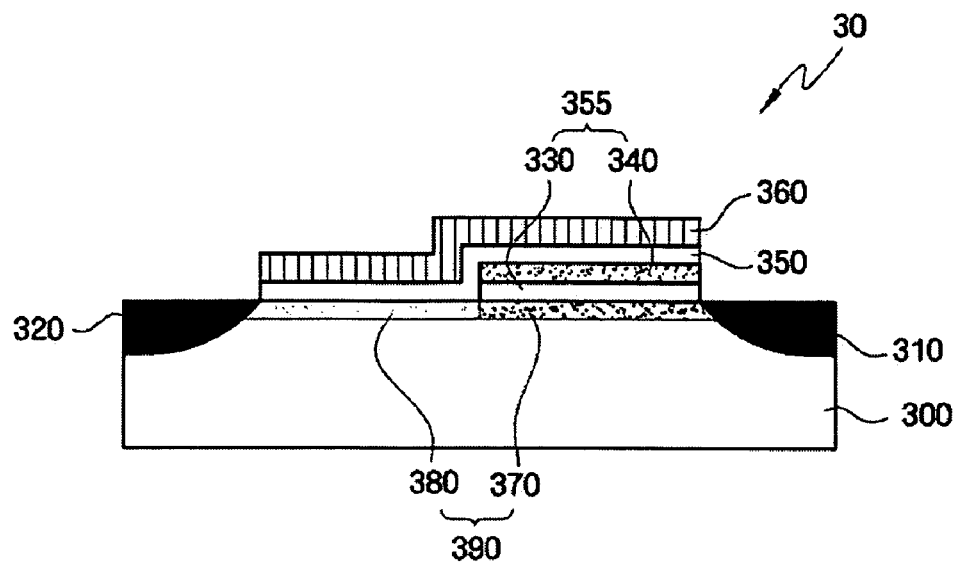
FIG. 3A is a cross-sectional view of a non-volatile memory device according to a first embodiment of the present invention.
Figure 3B:
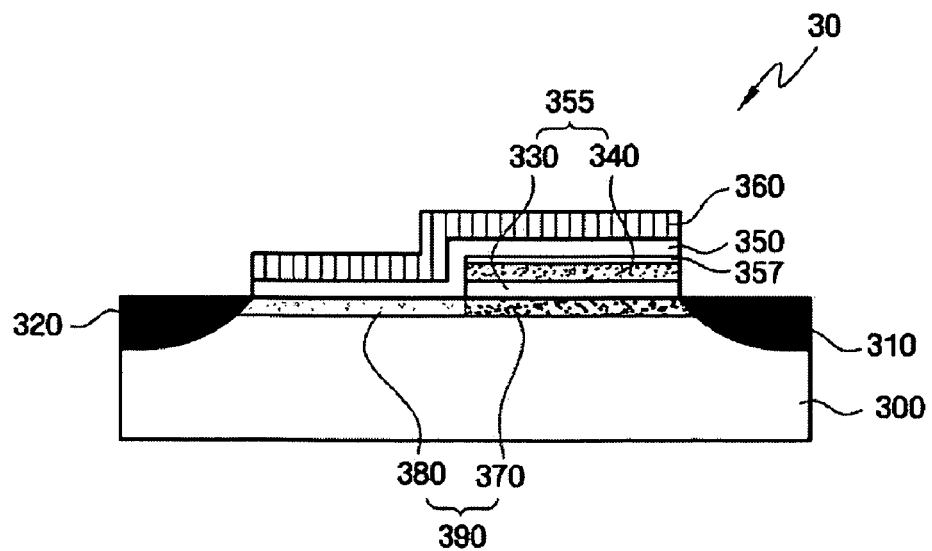
FIG. 3B is a cross-sectional view of a non-volatile memory device including a buffering layer according to other embodiments of the present invention.

FIG. 3A is a cross-sectional view of a non-volatile memory device according to a first embodiment of the present invention. FIG. 3B is a cross-sectional view of a non-volatile memory device including a buffering layer according to other embodiments of the present invention.

As shown in FIG. 3A, a non-volatile memory device 30 according to the first embodiment of the present invention includes a semiconductor substrate 300, a source region 310, a drain region 320, a trapping structure 355, a gate insulating layer 350, a gate electrode 360 and a channel region 390. The source region 310 and the drain region 320 are formed in the semiconductor substrate 300 and doped with n-type impurities. The trapping structure 355 includes a tunneling layer 330, which is disposed on a predetermined region of the semiconductor substrate 300 and through which charge carriers are tunneled, and a charge trapping layer 340, which is formed on the tunneling layer 330 and in which the tunneled charge carriers are trapped. The gate insulating layer 350 is formed on the trapping structure 355 and the exposed semiconductor substrate 300. The gate electrode 360 is formed on the gate insulating layer 350. The channel region 390 is formed between the source region 310 and the drain region 320 and includes a first channel region 370 formed beneath the trapping structure 355 and a second channel region 380 formed beneath the gate insulating layer 350. Here, the threshold voltage of the first channel region 370 is lower than that of the second channel region 380.

As described above, one method of making the threshold voltage of the first channel region 370 lower than that of the second channel region 380 is to make the concentration of holes of the second channel region 380 higher than that of the first channel region 370.

A method for making the concentration of the holes of the second channel region 380 higher than that of the first channel region 370 is to dope the first channel region 370 with n-type impurities and the second channel region 380 with p-type impurities. Otherwise, the first channel region 370 and the second channel region 380 are doped with p-type impurities and the second channel region 380 is doped with a higher concentration of p-type impurities than the first channel region 370.

Specifically, it is preferable that the threshold voltage of the first channel region 370 is lower than that of the second channel region 380 by 1V or more.

As a result, even after an erasing operation of the charge trapping layer 340 has been repeated a number of times (for example, 1,000 times), the threshold voltage of the first channel region 370 can still be lower than that of the second channel region 380.

The tunneling layer 330 is formed on the semiconductor substrate 300 so as to overlap the first channel region 370 and the charge trapping layer 340 is formed on the tunneling layer 330.

The structure comprising the tunneling layer 330 and the charge trapping layer 340 is defined as the trapping structure 355.

The tunneling layer 330 is a region where hot electrons from the semiconductor substrate 300 are tunneled during a programming operation of the non-volatile memory device 30, and must be a non-conductive insulating layer.

It is preferable that the non-conductive insulating layer useful as the tunneling layer 330 include at least one of an oxynitride layer and a silicon oxide ($SiO_x$) layer.

It is preferable that the length of the tunneling layer 330 be less than one-half the length of the channel region 390.

Thus, the tunneling layer 330 must overlap the first channel region 370, and preferably, the length of the tunneling layer 330 is not longer than the length of the first channel region 370.

The charge trapping layer 340 is a region where the tunneled hot electrons are trapped, and the charge trapping layer 340 should be a non-conductive layer.

Examples of the non-conductive layer useful as the charge trapping layer 340 include one or more layers each comprised of a material selected from the group consisting of silicon nitride ($SiN_x$), oxynitride, zirconium oxide ($ZrO_x$), aluminum oxide ($AlO_x$), hafnium oxide ($HfO_x$), lanthanum oxide ($LaO_x$), silicon oxide ($SiO_x$), silicon nano crystal, germanium nano crystal, and nano dot nitride, and a stack of one or more layers of these materials.

It is preferable that the length of the charge trapping layer 340 be less than one-half the length of the channel region 390. Thus, the charge trapping layer 340 must overlap the first channel region 370, and preferably, the length of the charge trapping layer 340 is not longer than the length of the first channel region 370.

The gate insulating layer 350 is conformally formed on the semiconductor substrate 300, on which the trapping structure 355 is formed, and the gate electrode 360 is formed on the gate insulating layer 350.

The gate insulating layer 350 is also referred to as a blocking layer for preventing charge carriers trapped by the charge trapping layer 340 from being discharged to the outside and preventing charge carriers from being injected from the gate electrode 360.

A non-conductive material is used as the gate insulating layer 350. Preferably, the non-conductive material includes at least one of an oxynitride layer and a silicon oxide ($SiO_x$) layer.

Optionally, as shown in FIG. 3B, a buffering layer 357 can be formed between the charge trapping layer 340 and the gate insulating layer 350. In a method of fabricating the non-volatile memory device according to the first embodiment of the present invention, the buffering layer 357 can be used to reduce damage to a surface of the charge trapping layer 340 in an ashing process for removing a photoresist pattern (not shown) from the charge trapping layer 340.

The buffering layer 357 must be formed of a non-conductive material and is preferably formed of one or more of oxynitride and silicon oxide ($SiO_x$).

The gate electrode 360 is formed on the gate insulating layer 350 and can be formed of polysilicon or a conductive metal such as aluminum or copper.

Although the non-volatile memory device having the source and drain regions 310 and 320 doped with n-type impurities has been described above, the source and drain regions 310 and 320 may alternatively be doped with p-type impurities.

In a case where the source and drain regions 310 and 320 are doped with p-type impurities, the threshold voltage of the first channel region 370 is preferably higher than that of the second channel region 380 by 1V or more.

As a result, even after an erasing operation has been repeated a number of times (for example, 1,000 times), the threshold voltage of the first channel region 370 can still be higher than that of the second channel region 380.

As described above, in order to make the threshold voltage of the first channel region 370 higher than that of the second channel region 380, the concentration of electrons of the first channel region 370 must be lower than the concentration of electrons of the second channel region 380.

One method of making the concentration of the electrons of the first channel region 370 lower than that of the second channel region 380 is to dope the first channel region 370 with p-type impurities and the second channel region 380 with n-type impurities. Otherwise, the first channel region 370 and the second channel region 380 are doped with n-type impurities and the second channel region 380 is doped with a higher concentration of n-type impurities than the first channel region 370.

Figure 4A:
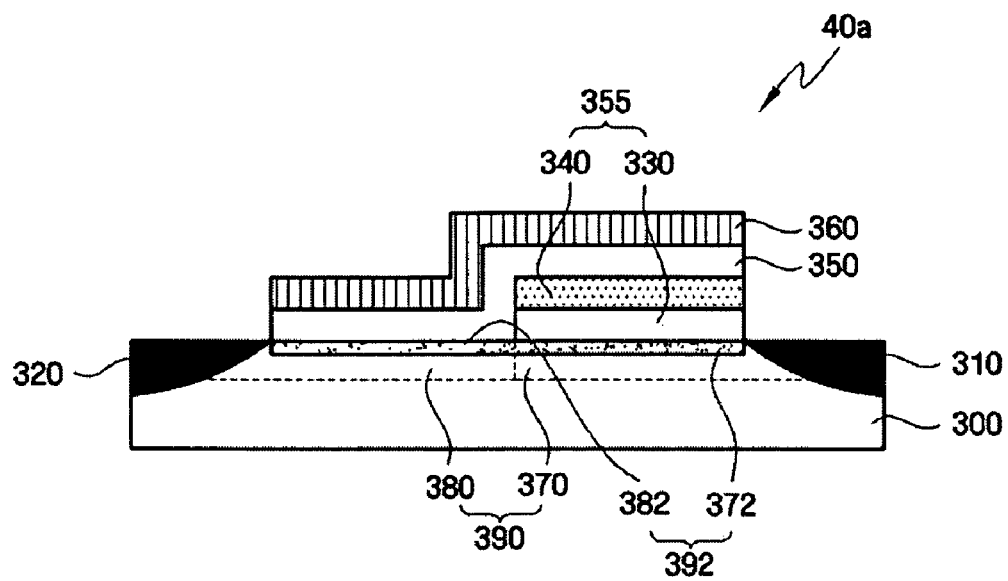
FIG. 4A is a cross-sectional view of a non-volatile memory device according to a second embodiment of the present invention.

FIG. 4A is a cross-sectional view of a non-volatile memory device according to a second embodiment of the present invention.

As shown in FIG. 4A, a non-volatile memory device 40a according to the second embodiment of the present invention includes a semiconductor substrate 300, a source region 310, a drain region 320, a trapping structure 355 comprised of a tunneling layer 330 and a charge trapping layer 340, a gate insulating layer 350, a gate electrode 360, a channel region 390 comprised of a first channel region 370 and a second channel region 380, and a doping region 392.

Since the locations, functions and structures of components of the second embodiment except the doping region 392 are the same as those of the embodiments shown in FIGS. 3A and 3B, description thereof will not be repeated, and only the doping region 392 will be described below.

The doping region 392 is a region where impurities are doped. The doping region 392 is comprised of a first doping region 372 formed at a predetermined location inside of the first channel region 370 and a second doping region 382 formed at a predetermined location inside of the second channel region 380.

The first doping region 372 is preferably formed in the first channel region 370 in the semiconductor substrate 300 to be adjacent to the tunneling layer 330 of the trapping structure 355 in consideration of a fabrication process. The second doping region 382 is also preferably formed in the second channel region 380 in the semiconductor substrate 300 to be adjacent to the gate insulating layer 350 in consideration of a fabrication process.

Figure 1:
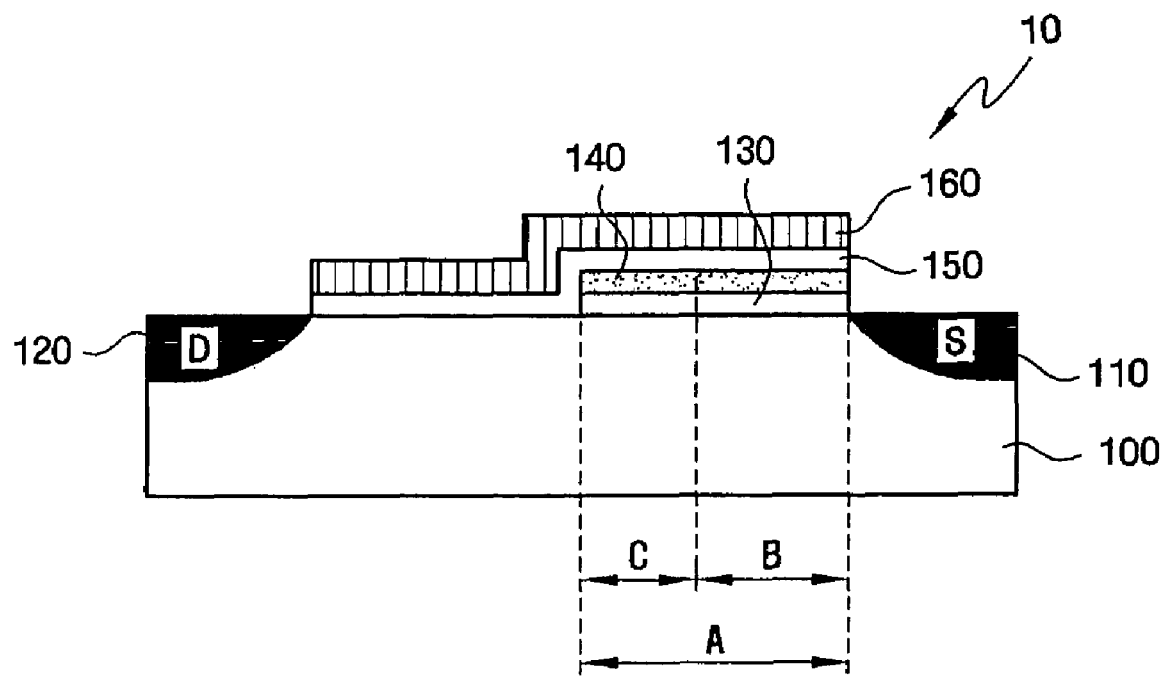
FIG. 1 is a cross-sectional view illustrating programming and erasing operations of a conventional local Oxide-Nitride-Oxide (ONO) non-volatile memory device.

As an erasing operation is actually repeated inside the charge trapping layer 340, it does not matter whether the first doping region 372 is formed on the entire surface of or on a partial surface of the semiconductor substrate 300, in which the first channel region 370 adjoins the trapping structure 355, when considering that a region where charge carriers are not completely erased (refer to the region C of FIG. 1) is limited to a predetermined region of the charge trapping layer 340.

In a case where the source and drain regions 310 and 320 of the non-volatile memory device 40a according to the second embodiment of the present invention are doped with n-type impurities, the threshold voltage of the first doping region 372 has a lower value than that of the second doping region 382 (by 1V or more, preferably).

As described above, in order to make the threshold voltage of the first doping region 372 lower than that of the second doping region 382, the concentration of holes of the second doping region 382 must be higher than that of the first doping region 372.

In order to make the concentration of holes of the second doping region 382 higher than that of the first doping region 372, the first doping region 372 is doped with n-type impurities and the second doping region 382 is doped with p-type impurities. Otherwise, the first doping region 372 and the second doping region 382 are doped with p-type impurities and the second doping region 382 is doped with a higher concentration of p-type impurities than the first doping region 372.

Even after an erasing operation has been repeated a number of times (for example, 1,000 times) in the non-volatile memory device 40a according to the second embodiment of the present invention, the threshold voltage of the first doping region 372 is still lower than that of the second doping region 382.

In a case where the source and drain regions 310 and 320 of the non-volatile memory device 40a according to the second embodiment of the present invention are doped with p-type impurities, the threshold voltage of the first doping region 372 has a higher value than that of the second doping region 382 (preferably, by 1V or more).

In order to make the threshold voltage of the first doping region 372 higher than that of the second doping region 382, the concentration of electrons of the first doping region 372 must be lower than that of electrons of the second doping region 382.

In order to make the concentration of the electrons of the first doping region 372 lower than that of the electrons of the second doping region 382, the first doping region 372 is doped with p-type impurities and the second doping region 382 is doped with n-type impurities. Otherwise, the first doping region 372 and the second doping region 382 are doped with n-type impurities and the second doping region 382 is doped with the higher concentration of n-type impurities than the first doping region 372.

Even after an erasing operation has been repeated a number of times (for example, 1,000 times) in the non-volatile memory device 40a according to the second embodiment of the present invention, the threshold voltage of the first doping region 372 is still higher than that of the second doping region 382.

A buffering layer (not shown) may be formed between the charge trapping layer 340 and the gate insulating layer 350 in the non-volatile memory device 40a according to the second embodiment of the present invention. In the method for fabricating the non-volatile memory device 40a according to the second embodiment of the present invention, the buffering layer can be used to reduce damage to a surface of the charge trapping layer 340 in an ashing process for removing a photoresist pattern (not shown) from the charge trapping layer 340.

The buffering layer must be formed of a non-conductive material and is preferably formed of one or more of oxynitride and silicon oxide ($SiO_x$).

Figure 4B:
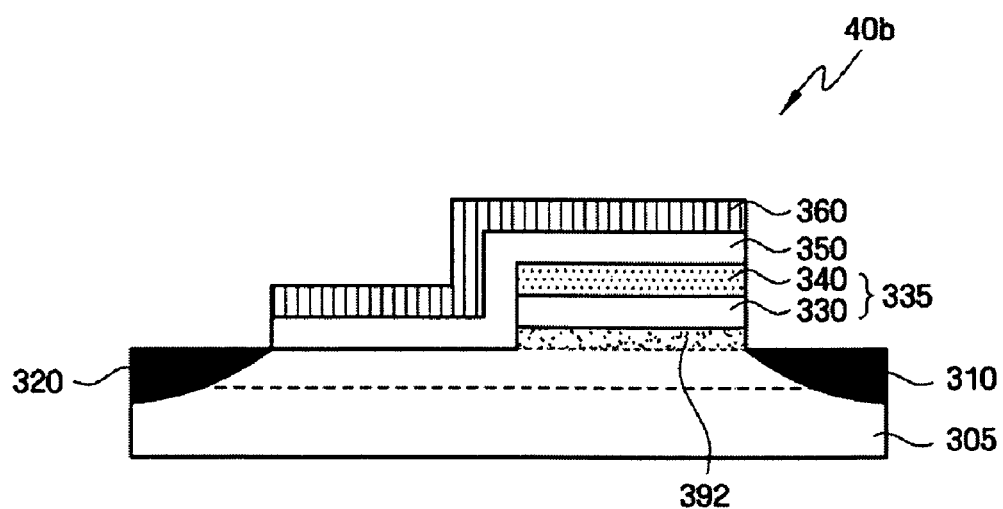
FIG. 4B is a cross-sectional view of a non-volatile memory device according to a third embodiment of the present invention.

FIG. 4B is a cross-sectional view of a non-volatile memory device according to a third embodiment of the present invention.

Since the locations, functions and structures of components of the third embodiment except a semiconductor substrate 305 are the same as those of the embodiments shown in FIGS. 3A and 3B, description thereof will not be repeated, and only the semiconductor substrate 305 will be described below.

As shown in FIG. 4B, a non-volatile memory device 40b according to the third embodiment of the present invention includes the semiconductor substrate 305 having a mesa-typed doping region 392, a source region 310, a drain region 320, a trapping structure 355 comprised of a tunneling layer 330 and a charge trapping layer 340, a gate insulating layer 350, a gate electrode 360 and a channel region 390 comprised of a first channel region 370 and a second channel region 380.

As shown in FIG. 4B, the semiconductor substrate 305 of the non-volatile memory device 40b according to the third embodiment of the present invention has the mesa-typed doping region 392 located in a predetermined region thereof. The trapping structure 355 is formed on an upper part of the mesa-typed doping region 392 and the first channel region 370 is formed on a lower upper part thereof.

The mesa-typed doping region 392 is doped with the same conductivity type impurities as the source and drain regions 310 and 320.

That is, in a case where the source and drain regions 310 and 320 are doped with n-type impurities in the non-volatile memory device 40b according to the third embodiment of the present invention, the mesa-typed doping region 392 is doped with n-type impurities.

Further, in a case where the source and drain regions 310 and 320 are doped with p-type impurities, the mesa-typed doping region 392 is doped with p-type impurities.

In a case where the source and drain regions 310 and 320 and the mesa-typed doping region 392 are doped with n-type impurities, the threshold voltage of the first channel region 370 on the lower part of the mesa-typed doping region 392 is lower than that of the second channel region 380 (by 1V or more, preferably).

Even after an erasing operation of the trapping structure 355 has been repeated a number of times (for example, 1,000 times), the threshold voltage of the first channel region 370 is still lower than that of the second channel region 380 (preferably by 1V or more).

Accordingly, as an erasing operation is repeated, the critical voltage of the first channel region 370 becomes higher so that a characteristic of the erasing operation is not degraded in the present invention, unlike in the prior art.

Similarly, in a case where the source and drain regions 310 and 320 and the mesa-typed doping region 392 are doped with p-type impurities, the threshold voltage of the first channel region 370 on the lower part of the mesa-typed doping region 392 is higher than that of the second channel region 380 (by 1V or more, preferably). Even after an erasing operation of the trapping structure 355 has been repeated a number of times (for example, 1,000 times), the threshold voltage of the first channel region 370 is still higher than that of the second channel region 380 (preferably, by 1V or more).

Figure 4C:
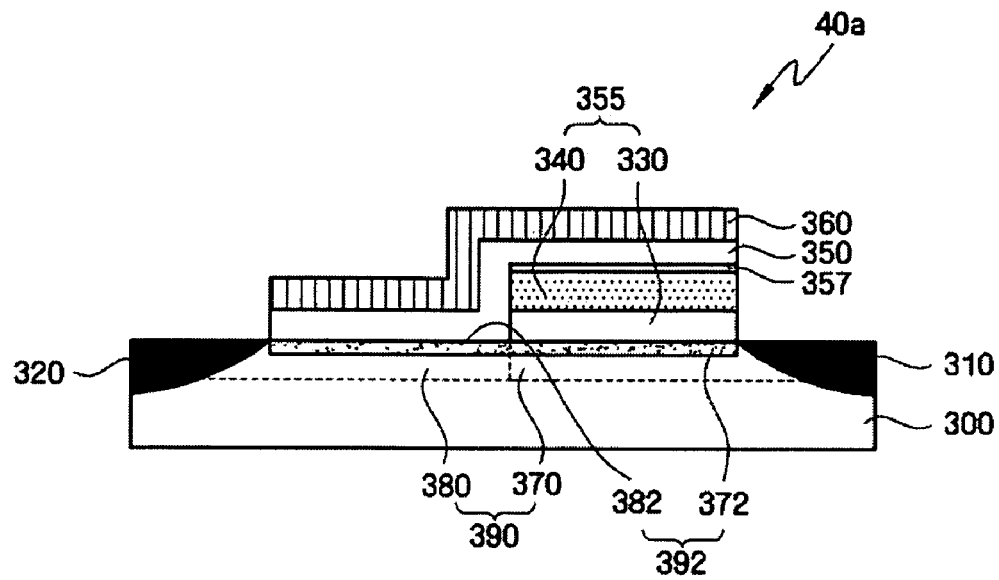
FIG. 4C is a cross-sectional view of a non-volatile memory device including a buffering layer according to other embodiments of the present invention.
Figure 4D:
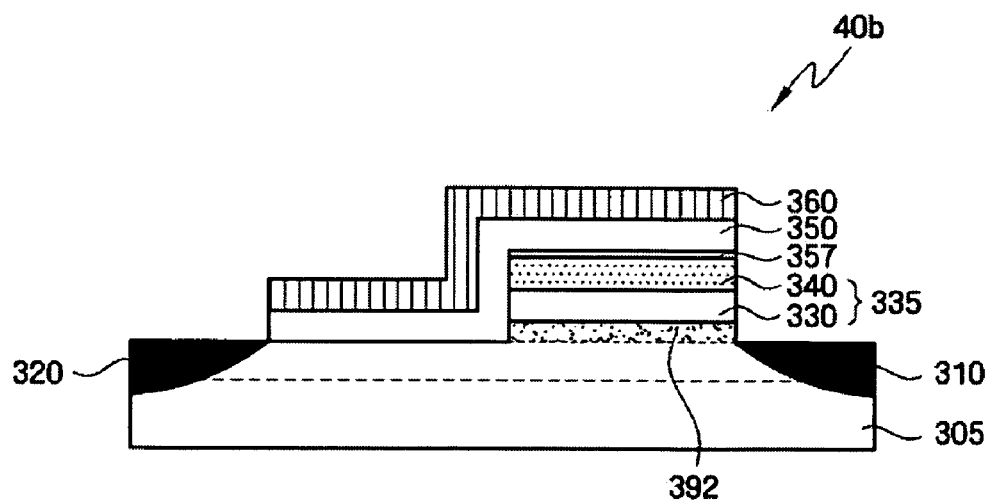
FIG. 4D is a cross-sectional view of a non-volatile memory device including a buffering layer according to other embodiments of the present invention.

A buffering layer 357, as shown in FIGS. 4C and 4D, may be formed between the charge trapping layer 340 and the gate insulating layer 350 in the non-volatile memory device 40b according to other embodiments of the present invention. In the method for fabricating the non-volatile memory device 40b according to the third embodiment of the present invention, the buffering layer 357 can be used to reduce damage to a surface of the charge trapping layer 340 in an ashing process for removing a photoresist pattern (not shown) from the charge trapping layer 340.

The buffering layer 357 must be formed of a non-conductive material and is preferably formed of one more of oxynitride and silicon oxide ($SiO_x$).

Figure 5:
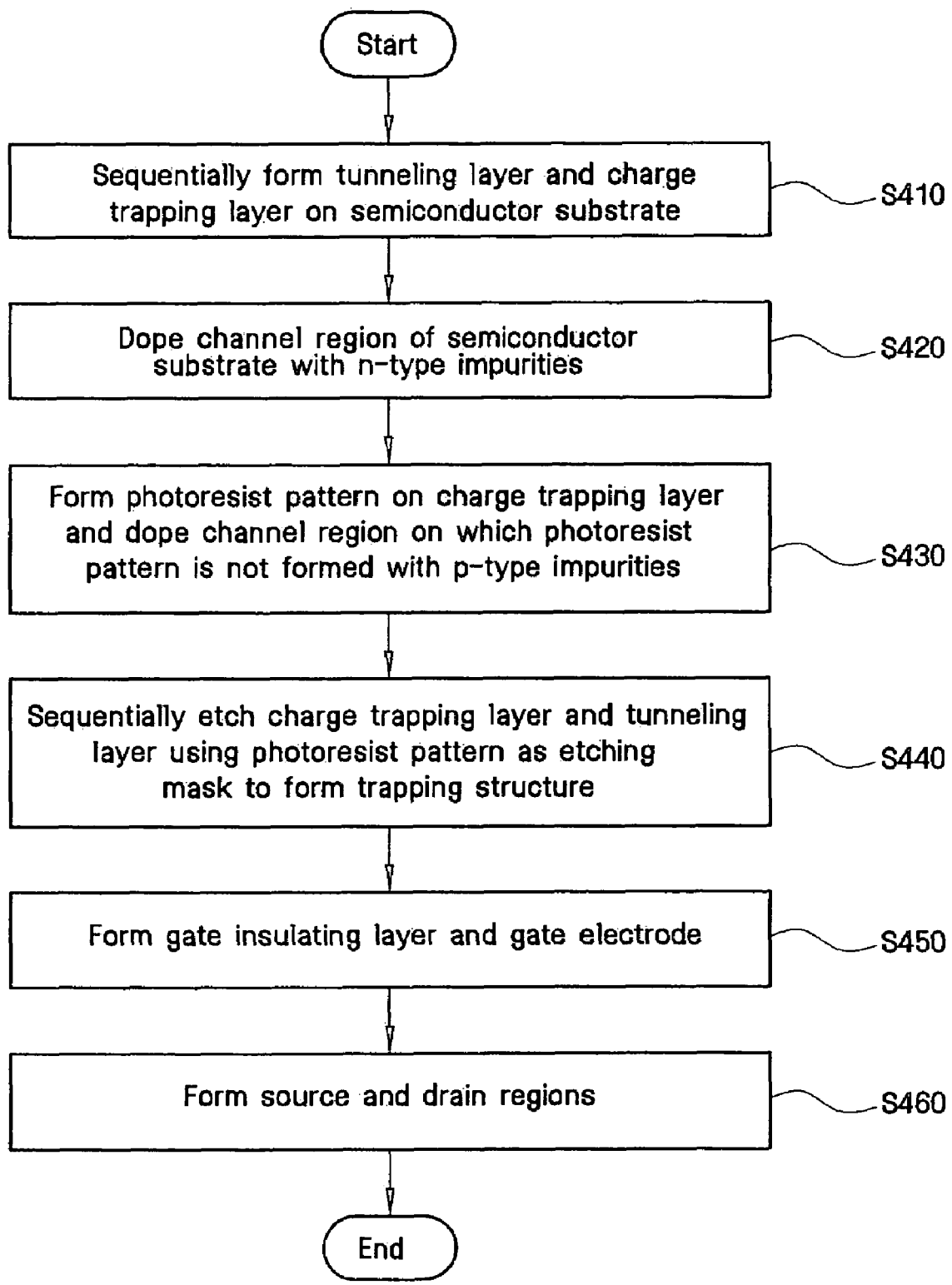
FIG. 5 is a process flow chart illustrating a method of fabricating the non-volatile memory device according to the first embodiment of the present invention.

FIG. 5 is a process flow chart illustrating a method for fabricating the non-volatile memory device according to the first embodiment of the present invention. FIGS. 6A through 6G are cross-sectional views sequentially illustrating stages in the method of FIG. 5.

The method for fabricating the non-volatile memory device according to the first embodiment of the present invention is described with reference to FIG. 5 and FIGS. 6A through 6G.

Figure 6A:
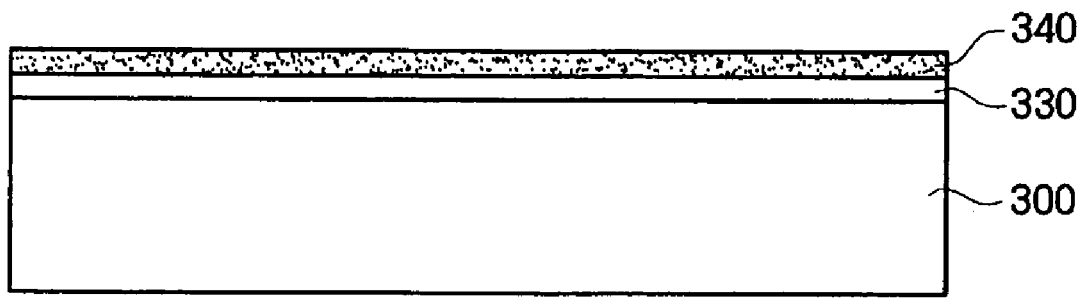
FIGS. 6A through 6G are cross-sectional views sequentially illustrating stages in the method of FIG. 5.

First, as shown in FIG. 6A, the tunneling layer 330 and the charge trapping layer 340 are sequentially formed on the semiconductor substrate 300 (step S410).

Here, the tunneling layer 330 is a region where hot electrons from the semiconductor substrate 300 are tunneled during a programming operation of the non-volatile memory device 30, and must be a non-conductive insulating layer. Preferably, the non-conductive insulating layer useful as the tunneling layer 330 includes at least one of an oxynitride layer and a silicon oxide ($SiO_x$) layer.

In order to form the tunneling layer 330, a thermal electron diffusion method or an atomic layer deposition (ALD) method may be used. Preferably, a chemical vapor deposition (CVD) method is used.

The charge trapping layer 340 is a region where the tunneled hot electrons are trapped, and the charge trapping layer 340 should be a non-conductive layer.

Examples of the non-conductive layer useful as the charge trapping layer 340 include one or more layers each comprised of a material selected from the group consisting of silicon nitride ($SiN_x$), oxynitride, zirconium oxide ($ZrO_x$), aluminum oxide ($AlO_x$), hafnium oxide ($HfO_x$), lanthanum oxide ($LaO_x$), silicon oxide ($SiO_x$), silicon nano crystal, germanium nano crystal, nano dot nitride.

In order to form the charge trapping layer 340, a thermal electron diffusion method or an atomic layer deposition (ALD) method may be used. Preferably, a chemical vapor deposition (CVD) method is used.

A buffering layer (not shown) may further be formed after forming the charge trapping layer 340.

In the method of fabricating the non-volatile memory device according to the first embodiment of the present invention, the buffering layer can be used to reduce damage to a surface of the charge trapping layer 340 in an ashing process for removing a photoresist pattern (not shown) from the charge trapping layer 340.

The buffering layer must be formed of a non-conductive material and is preferably formed of one or more of oxynitride and silicon oxide ($SiO_x$).

Next, the channel region of the semiconductor substrate is doped with n-type impurities (step S420).

Figure 6B:
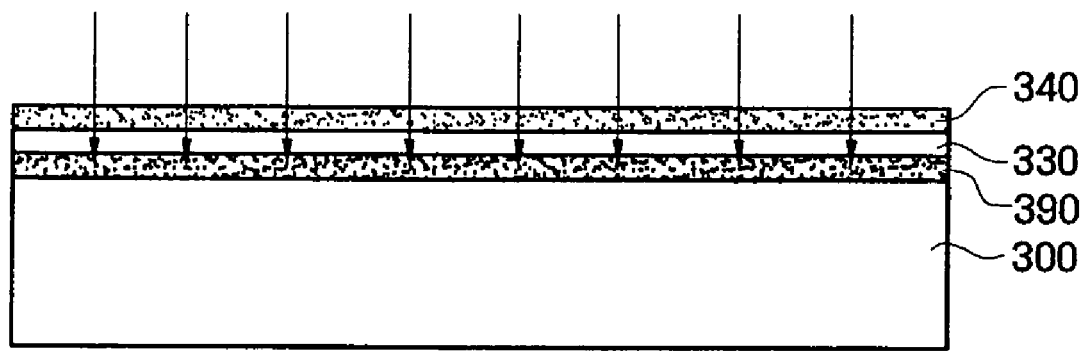

As shown in FIG. 6B, the channel region 390 under the surface of the semiconductor substrate 300 is doped with n-type impurities using an implantation method.

The channel region 390 of the semiconductor substrate 300 is doped with n-type impurities to lower the threshold voltage of the doped region.

Next, a photoresist pattern 345 is formed on the charge trapping layer 340 and then the channel region on which the photoresist pattern 345 is not formed is doped with p-type impurities using the photoresist pattern 345 as a mask (step S430).

Figure 6C:
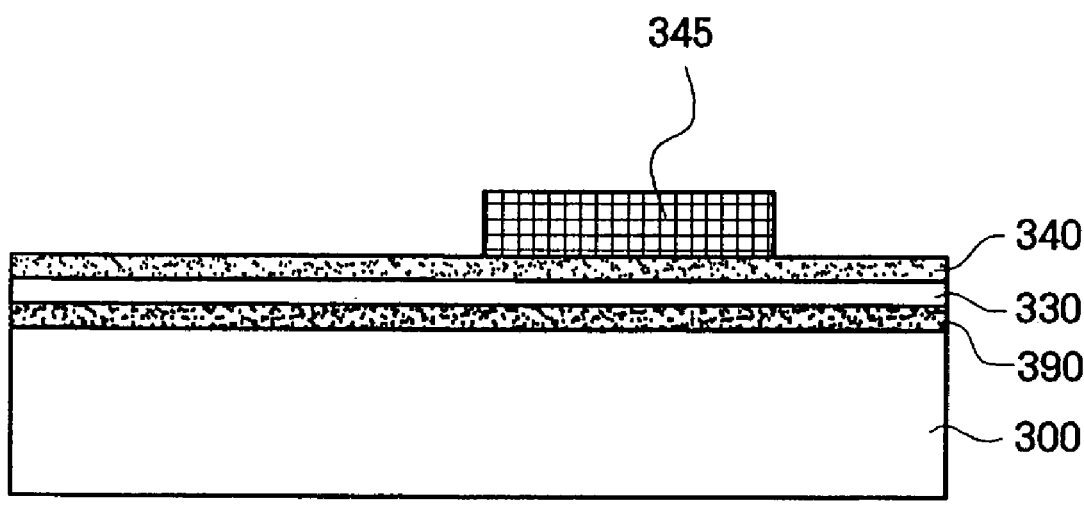
Figure 6D:
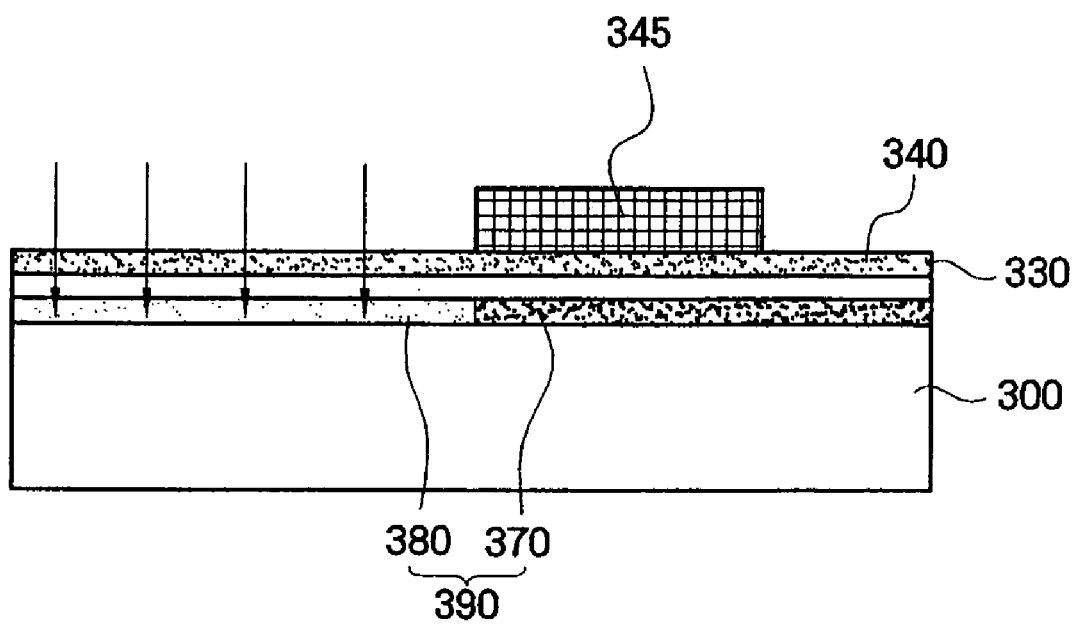

As shown in FIG. 6C, the photoresist pattern 345 is formed on the charge trapping layer 340. As shown in FIG. 6D, the second channel region 380 under a portion of the charge trapping layer 340, on which the photoresist pattern 345 is not formed, is doped with p-type impurities by an implantation method using the photoresist pattern 345 as a mask.

At this time, the second channel region 380 is doped with p-type impurities to make the threshold voltage of the second channel region 380 higher than that of the first channel region 370 which is not doped with p-type impurities.

As described above, the method for doping the second channel region 380 with p-type impurities after the whole channel region 390 is doped with n-type impurities is used in order to make the threshold voltage of the first channel region 370 lower than that of the second channel region 380. However, a method for making the concentration of holes of the second channel region 380 higher than that of the first channel region 370 can be used. For example, the second channel region 380 of the semiconductor substrate 300 doped with p-type impurities can be doped with p-type impurities using the photoresist pattern 345 as a mask, thereby making the doping concentration of p-type impurities of the second channel region 380 higher than that of the first channel region 370.

Next, the portions of the charge trapping layer 340 and the tunneling layer 330, on which the photoresist pattern 345 is not formed, are sequentially etched using the photoresist pattern 345 as a mask, thereby forming the trapping structure 355 (step S440).

Figure 6E:
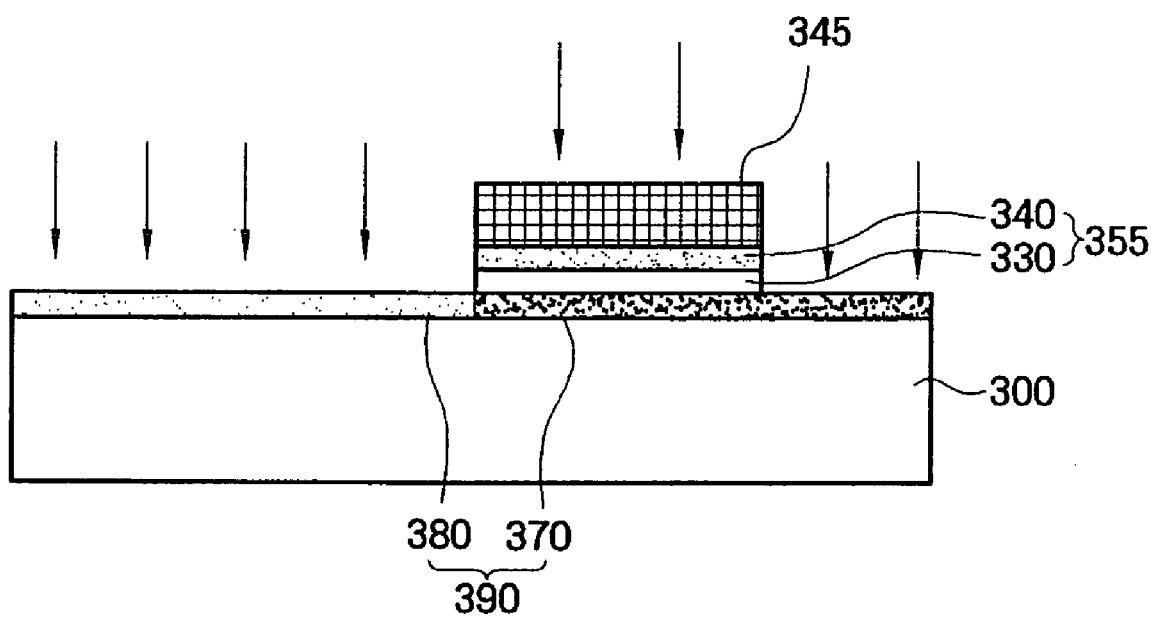

As shown in FIG. 6E, the portions of the charge trapping layer 340 and the tunneling layer 330 on which the photoresist pattern 345 is not formed are sequentially etched using the photoresist pattern 345 as an etching mask.

It is preferable that the etching be plasma etching capable of performing anisotropic etching. After etching, the trapping structure 355 including the charge trapping layer 340 and the tunneling layer 330 is formed on a lower part of the photoresist pattern 345.

Charges within the semiconductor substrate 300 tunnel through the tunneling layer 330 of the trapping structure 355 and are then trapped by the charge trapping layer 340.

Next, the photoresist pattern 345 is removed, the gate insulating layer 350 is deposited on the trapping structure 355, the semiconductor substrate 300 exposed by the etching and the gate electrode 360 is then deposited on the gate insulating layer 350, followed by removing portions of the gate insulating layer 350 and the gate electrode 360 overlapped on the source and drain regions 310 and 320 which are to be formed in a subsequent process (step S450).

Figure 6F:
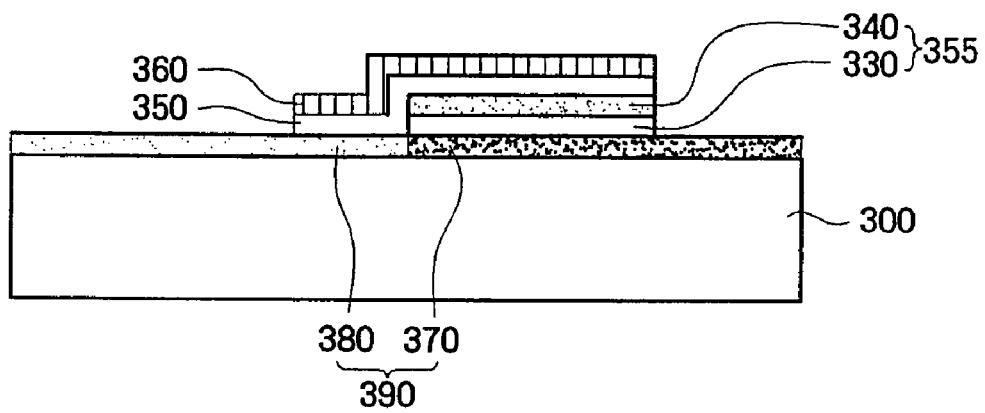

As shown in FIG. 6F, the gate insulating layer 350 is referred to as a blocking layer for preventing charge carriers stored in the charge trapping layer 340 from being discharged to the outside or preventing charge carriers from being injected from the gate electrode 360.

Here, in a case where a buffering layer (not shown) is additionally formed, the gate insulating layer 350 will be formed on the buffering layer formed on the charge trapping layer 340.

The gate insulating layer 350 should be a non-conductive material layer, and preferably includes at least one of an oxynitride layer and a silicon oxide ($SiO_x$) layer.

In order to form the gate insulating layer 350, a thermal electron diffusion method or an atomic layer deposition (ALD) method may be used. Preferably, a chemical vapor deposition (CVD) method is used.

The gate electrode 360 is formed on the gate insulating layer 350, and polysilicon or a conductive metal such as Al or Cu may be used as a material for the gate electrode 360. When polysilicon is used as a material for the gate electrode 360, the gate electrode 360 has a silicon-oxide-nitride-oxide-silicon (SONOS) structure. When a conductive metal is used as a material for the gate electrode 360, the gate electrode 360 has a metal-oxide-nitride-oxide-silicon (MONOS) structure.

Finally, the source and drain regions 310 and 320 are formed (step S460).

Figure 6G:
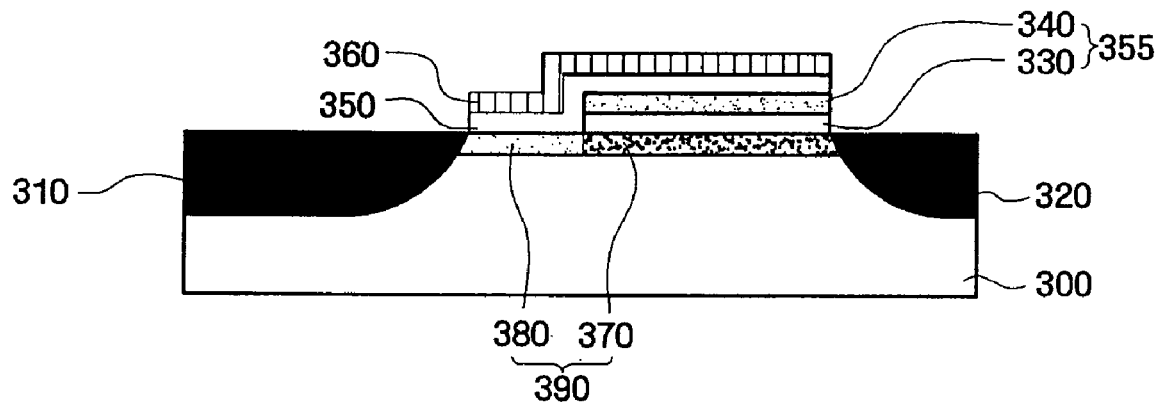

As shown in FIG. 6G, the source region 310 and the drain region 320 are formed at a side of the second channel region 380 and a side of the first channel region 370 by doping the substrate with n-type impurities.

Although the description was given of an example of a case where the source and drain regions 310 and 320 are doped with n-type impurities in the above-described method for fabricating the non-volatile memory device having the asymmetric channel structure, the method for fabricating the non-volatile memory device having the asymmetric channel structure according to the present invention can be applied to a case where the source and drain regions 310 and 320 are doped with p-type impurities.

FIG. 7 is a process flow chart illustrating a method for fabricating the non-volatile memory device according to the second embodiment of the present invention. FIGS. 8A through 8G are cross-sectional views sequentially illustrating stages in the method of FIG. 7.

Hereinafter, the method for fabricating the non-volatile memory device according to the second embodiment of the present invention is described with reference to FIG. 7 and FIGS. 8A through 8G.

First, a doping region doped with n-type impurities is formed in a top portion of the semiconductor substrate (step S710).

Figure 8A:
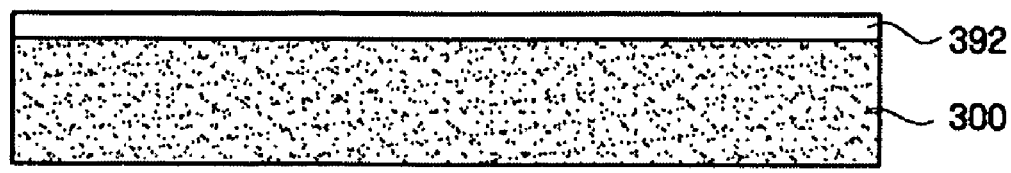
FIGS. 8A through 8G are cross-sectional views sequentially illustrating stages in the method of FIG. 7.

As shown in FIG. 8A, the doping region 392 is formed in a top portion of the semiconductor substrate 300. The doping region 392 can be formed by an ion-implantation method or using a semiconductor device using plasma.

The doping region 392 is doped with n-type impurities because the source and drain regions, which will be formed later, are to be doped with n-type impurities.

Likewise, if the source and drain regions are doped with p-type impurities, the doping region 392 is doped with p-type impurities.

Figure 8B:
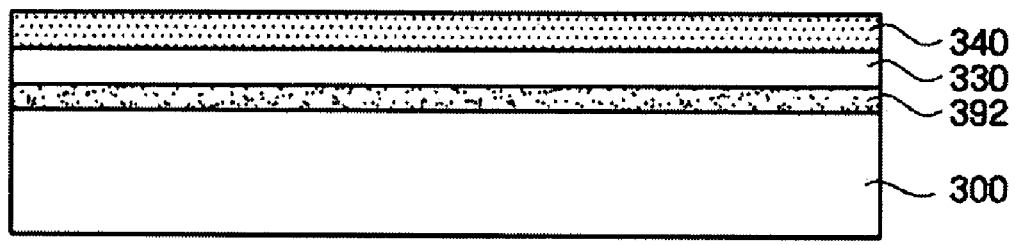

Next, as shown in FIG. 8B, the tunneling layer 330 and the charge trapping layer 340 are sequentially formed on the semiconductor substrate 300 (step S720).

The tunneling layer 330 is a region where hot electrons from the semiconductor substrate 300 are tunneled during a programming operation of the non-volatile memory device 30, and is a non-conductive insulating layer. The tunneling layer 330 preferably includes at least one of an oxynitride layer and a silicon oxide ($SiO_x$) layer.

In order to form the tunneling layer 330, a thermal electron diffusion method or an atomic layer deposition (ALD) method may be used. Preferably, a chemical vapor deposition (CVD) method is used.

The charge trapping layer 340 is a region where the tunneled hot electrons are trapped, and the charge trapping layer 340 should be a non-conductive layer.

Examples of the non-conductive layer useful as the charge trapping layer 340 include one or more layers each comprised of a material selected from the group consisting of silicon nitride ($SiN_x$), oxynitride, zirconium oxide ($ZrO_x$), aluminum oxide ($AlO_x$), hafnium oxide ($HfO_x$), lanthanum oxide ($LaO_x$), silicon oxide ($SiO_x$), silicon nano crystal, germanium nano crystal, nano dot nitride.

In order to form the charge trapping layer 340, a thermal electron diffusion method or an atomic layer deposition (ALD) method may be used. Preferably, a chemical vapor deposition (CVD) method is used.

A buffering layer (not shown) may further be formed after forming the charge trapping layer 340.

In the method of fabricating the non-volatile memory device according to the second embodiment of the present invention, the buffering layer can be used to reduce damage to a surface of the charge trapping layer 340 in an ashing process for removing a photoresist pattern (not shown) from the charge trapping layer 340.

The buffering layer must be formed of a non-conductive material and is preferably formed of one or more of oxynitride and silicon oxide ($SiO_x$).

Figure 8C:
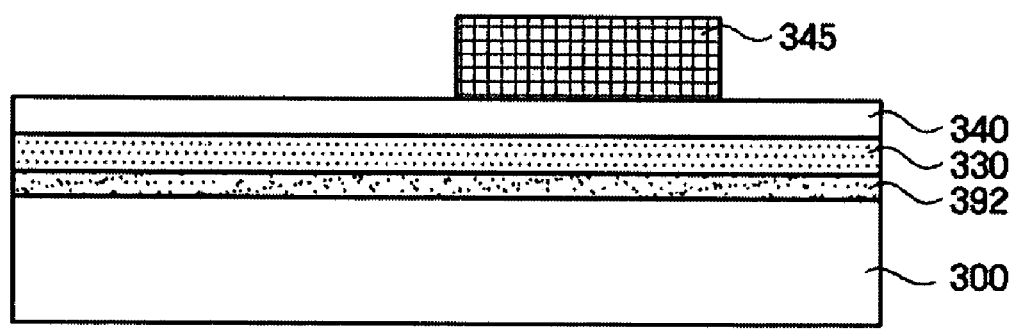

Next, as shown in FIG. 8C, a photoresist pattern 345 is formed on the charge trapping layer 340 (step S730).

At this time, a portion defined by the photoresist pattern 345 is defined as a charge storing region (referred to as a trapping structure).

Figure 8D:
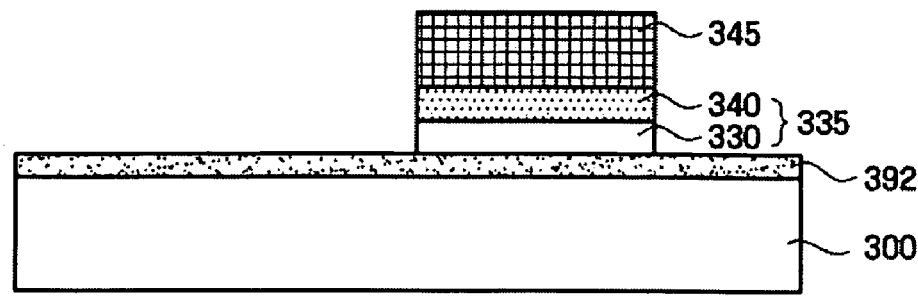
Figure 8E:
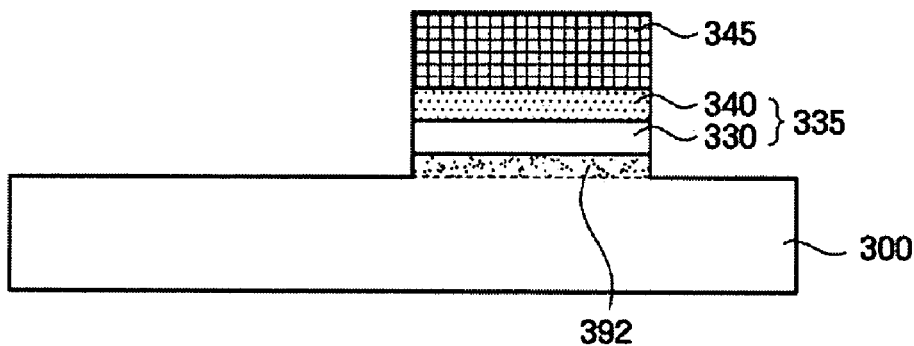

Next, as shown in FIGS. 8D and 8E, an etching process is performed using the photoresist pattern 345 as an etching mask to form the trapping structure (step S740).

Since the etching process is performed using the photoresist pattern 345 as the etching mask, portions of the charge trapping layer 340, the tunneling layer 330 and the doping region 392 formed on a portion in which the photoresist pattern 345 is not defined are removed. As a result, the doping region 392 exists in a lower part of the photoresist pattern 345 and the trapping structure 355 comprised of the tunneling layer 330 and the charge trapping layer 340 is formed.

At this time, it is preferable that the etching be dry etching such as plasma etching capable of performing anisotropic etching.

It is preferable that the doping region 392 be etched together during the dry etching of the charge trapping layer 340 and the tunneling layer 330. However, the portions of the charge trapping layer 340 and the tunneling layer 330 formed on the portion in which the photoresist pattern 345 is not defined can first be etched using the dry etching to expose the doping region 392, and then, the exposed doping region 392 can be etched using wet etching having a high etching selectivity.

Charges within the semiconductor substrate 300 tunnel through the tunneling layer 330 of the trapping structure 355 and are then trapped by the charge trapping layer 340. The doping region 392 on a lower part of the trapping structure 355 is formed in order to lower the threshold voltage of the trapping structure 355.

In a case where the source and drain regions are doped with p-type impurities and the doping region 392 is doped with p-type impurities, the doping region 392 on the lower part of the trapping structure 355 is used to raise the threshold voltage of the trapping structure 355.

Figure 8F:
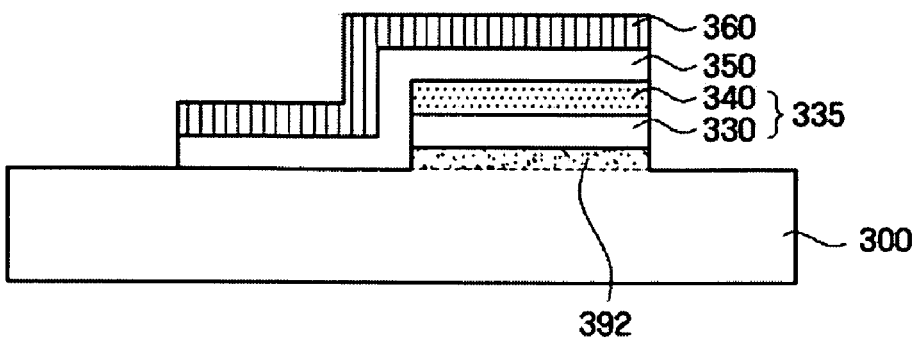

Next, as shown in FIG. 8F, the photoresist pattern 345 is removed and then the gate insulating layer 350 and the gate electrode 360 are sequentially formed on the semiconductor substrate 300 exposed by the etching process and the charge trapping layer 340 (step S750).

The gate insulating layer 350 is referred to as a blocking layer for preventing charge carriers stored in the charge trapping layer 340 from being discharged to the outside or preventing charge carriers from being injected from the gate electrode 360.

Here, in a case where a buffering layer (not shown) is additionally formed, the gate insulating layer 350 will be formed on the buffering layer formed on the charge trapping layer 340.

The gate insulating layer 350 should be a non-conductive material layer, and preferably includes at least one of an oxynitride layer and a silicon oxide ($SiO_x$) layer.

In order to form the gate insulating layer 350, a thermal electron diffusion method or an atomic layer deposition (ALD) method may be used. Preferably, a chemical vapor deposition (CVD) method is used.

The gate electrode 360 is formed on the gate insulating layer 350, and polysilicon or a conductive metal such as Al or Cu may be used as a material for the gate electrode 360. When polysilicon is used as a material for the gate electrode 360, the gate electrode 360 has a silicon-oxide-nitride-oxide-silicon (SONOS) structure. When a conductive metal is used as a material for the gate electrode 360, the gate electrode 360 has a metal-oxide-nitride-oxide-silicon (MONOS) structure.

Figure 8G:
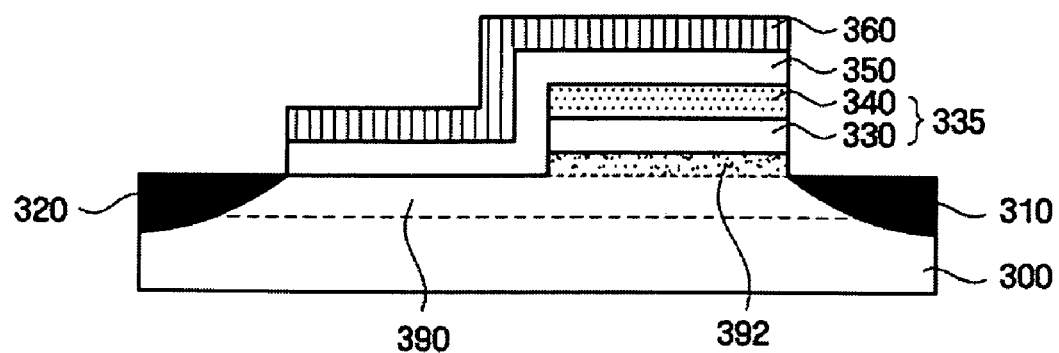

Finally, as shown in FIG. 8G, the source and drain regions doped with n-type impurities are formed at both sides of the channel region (step S760).

Here, the source and drain regions 310 and 320 are doped with n-type impurities. However, if the doping region 392 is doped with p-type impurities, the source and drain regions 310 and 320 will be doped with p-type impurities.

The reason of the foregoing is that impurities forming the doping region 392 and impurities forming the source and drain regions 310 and 320 must have the same valence electron in order to lower (when using n-type impurities) or raise (when using p-type impurities) the threshold voltage of a region where the doping region 392 is formed.

Figure 9A:
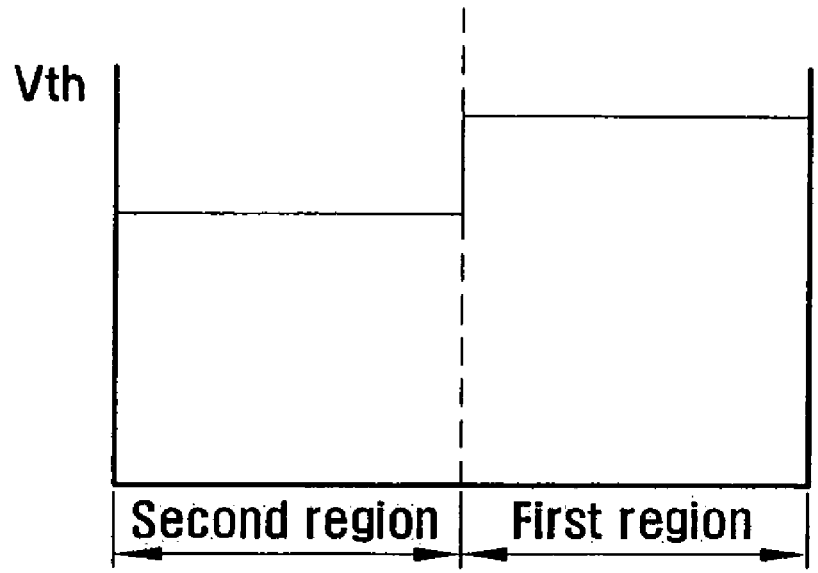
FIGS. 9A through 9C are graphs illustrating changes in the threshold voltages of a channel region (a first region) on which a trapping structure is formed and changes in the threshold voltages of a channel region (a second region) on which the trapping structure is not formed in a conventional non-volatile memory device.
Figure 9B:
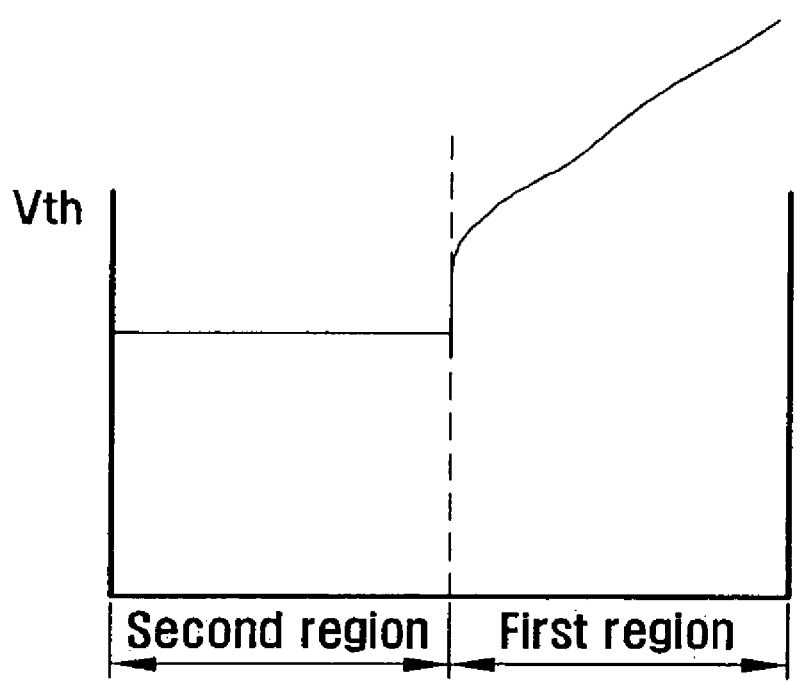
Figure 9C:
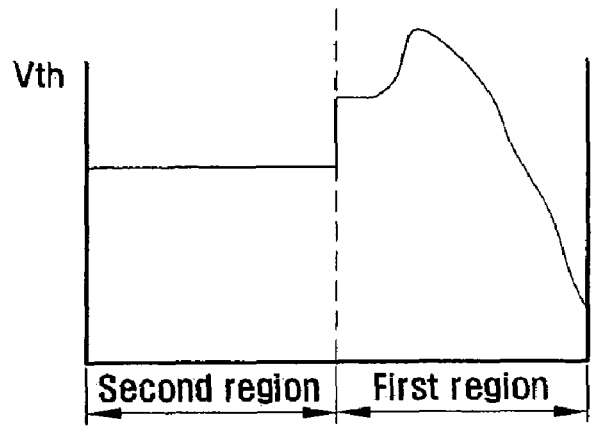

FIGS. 9A through 9C are graphs illustrating changes in the threshold voltages of a channel region (a first region) on which a trapping structure is formed and changes in the threshold voltages of a channel region (a second region) on which the trapping structure is not formed in a conventional non-volatile memory device.

FIG. 9A is a graph comparing the threshold voltage of the first region with the threshold voltage of the second region in an initial state. It can be understood that the threshold voltage of the first region is higher than that of the second region in the initial state due to the trapping structure formed on the first region.

FIG. 9B is a graph comparing the threshold voltage of the first region with the threshold voltage of the second region in a state in which cells are programmed. It can be understood that since charge carriers which are injected through a tunneling layer from the channel region are mainly trapped in the vicinity of a right edge of a charge trapping layer, the threshold voltage increases rapidly in the vicinity of the right edge.

FIG. 9C is a graph comparing the threshold voltage of the first region with the threshold voltage of the second region in a state in which the cells are erased. It can be understood that since holes passing the channel region start to be mainly filled into the right edge of the charge trapping layer and it is difficult to fill the left edge thereof with the holes, the threshold voltage in the vicinity of the right edge of the first region is rapidly decreased, however, the threshold voltage in the vicinity of the left edge of the first region is higher than the threshold voltage in the vicinity of the right edge of the first region.

If the programming and erasing cycles are repeated, the size of a region where the erasing operation by the holes is not performed is gradually increased in the charge trapping region.

That is, if a range of the charge trapping region where the erasing operation is not performed is increased, a current amount flowing in a channel region is decreased in a read operation of the non-volatile memory device and as a result, a read characteristic of the conventional non-volatile memory device will be reduced.

Figure 10:
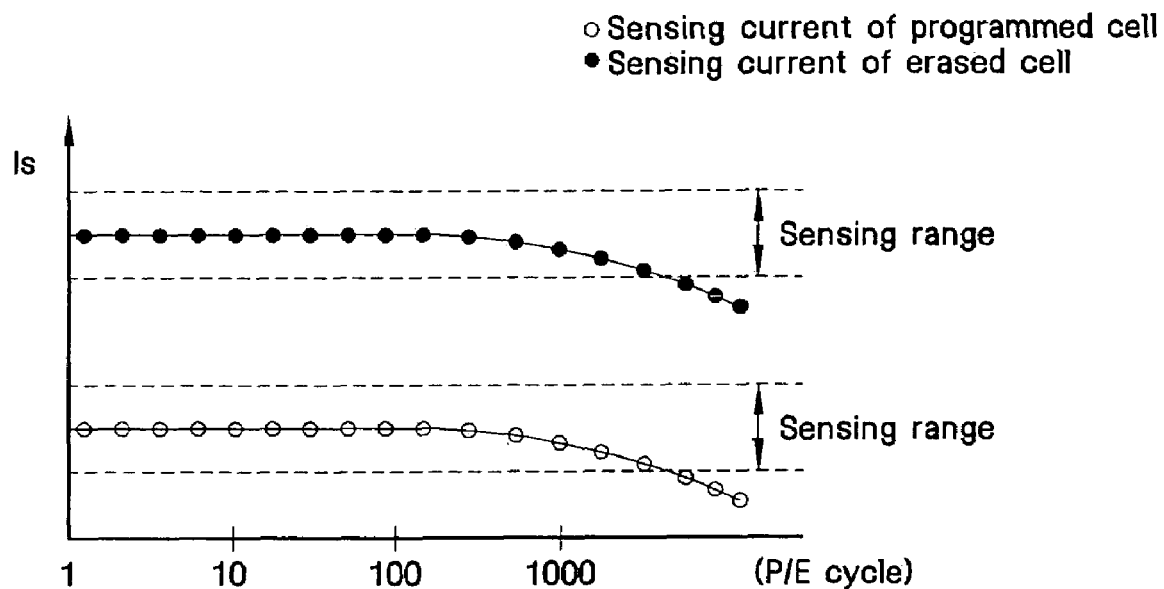
FIG. 10 is a graph illustrating changes in the amount of current ($I_s$) flowing in a channel region in a read operation of a cell as the number of programming and erasing cycles increases in a conventional non-volatile memory device.

FIG. 10 is a graph illustrating changes in the amount of current ($I_s$) flowing in a channel region in a read operation of a cell as the number of programming and erasing cycles increases in a conventional non-volatile memory device.

As shown in FIG. 10, it can be understood that the amount of current ($I_s$) in a read operation of a cell is gradually decreased as the number of programming and erasing cycles increases so that the amount of current ($I_s$) exceeds a sensing range at a point where the number of programming and erasing cycles is 1,000.

Figure 11A:
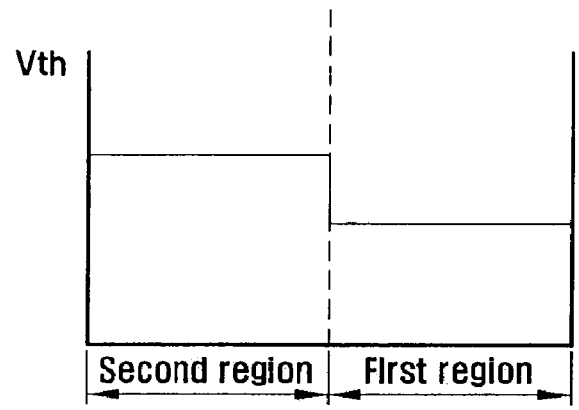
FIGS. 11A through 11C are graphs illustrating the threshold voltage of a first channel region and the threshold voltage of a second channel region in a non-volatile memory device having an asymmetric channel structure according to the present invention.
Figure 11B:
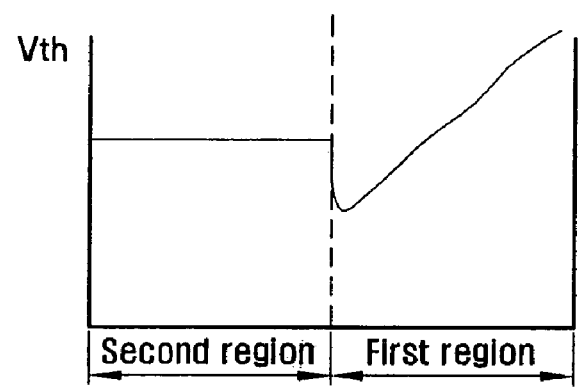
Figure 11C:
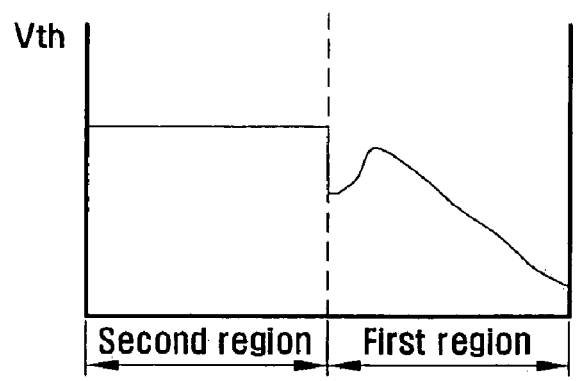

FIGS. 11A through 11C are graphs illustrating the threshold voltage of a first channel region and the threshold voltage of a second channel region in a non-volatile memory device having an asymmetric channel structure according to the present invention.

FIG. 11A is a graph illustrating the threshold voltages of the first channel region and the second channel region in an initial state. It can be understood that the threshold voltage of the first channel region is relatively lower than that of the second channel region in the initial state.

FIG. 11B is a graph illustrating the threshold voltages of the first channel region and the second channel region when the non-volatile memory device is programmed. It can be understood that since charge carriers which are injected through a tunneling layer from a channel region are mainly trapped in the vicinity of a right edge of a charge trapping layer, the threshold voltage increases rapidly in the vicinity of the right edge.

FIG. 11C is a graph illustrating the threshold voltages of the first channel region and the second channel region in a state in which the non-volatile memory device is erased. It can be understood that since holes passing the channel region start to be mainly filled into the right edge of the charge trapping layer and it is difficult tot fill the left edge thereof with the holes, the threshold voltage in the vicinity of the right edge is rapidly decreased, however, the threshold voltage in the vicinity of the left edge of the first channel region is higher than the threshold voltage in the vicinity of the right edge of the first channel region.

Although the threshold voltage in the vicinity of the left edge of the first channel region is higher than that in the vicinity of the right edge of the first channel region, the threshold voltage in the vicinity of the left edge of the first channel region is lower than threshold voltage of the second channel region.

Figure 12:
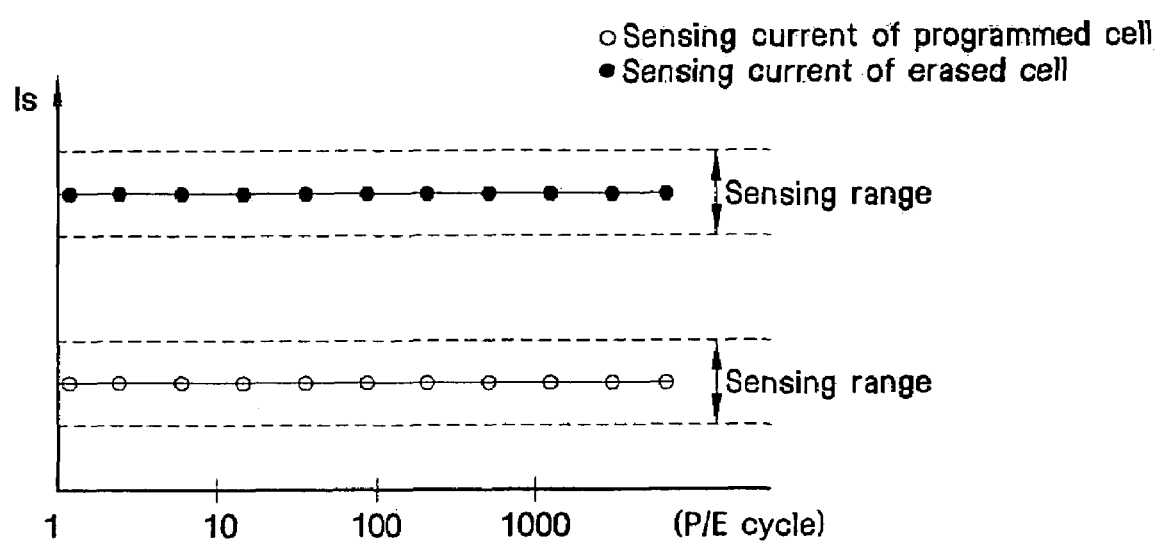
FIG. 12 is a graph illustrating changes in the amount of current ($I_s$) flowing in a channel region in a read operation of a cell as the number of programming and erasing cycles increases in a non-volatile memory device having an asymmetric channel structure according to the present invention.

FIG. 12 is a graph illustrating changes in the amount of current ($I_s$) flowing in a channel region in a read operation of a cell as the number of programming and erasing cycles increases in a non-volatile memory device having an asymmetric channel structure according to the present invention.

As shown in FIG. 12, the threshold voltage of a portion of the first channel region where an erasing operation is not performed is lower than that of the second channel region when a cell in the non-volatile memory device according to the present invention is in an erased state. Accordingly, it can be seen that even when the number of programming and erasing cycles is increased, a sensing current ($I_s$) in a read operation is not decreased.

A non-volatile memory device having an asymmetric channel structure and its manufacturing method of the present invention provide at least the following advantages.

First, the threshold voltage of a channel region can be partially controlled so that a memory cell can be prevented from being degraded according to a structure and a formal characteristic of the non-volatile memory device.

Second, even if the size of a non-erased region is increased in a charge trapping layer as the number of programming and erasing cycles increases, a sensing current in a read operation can be prevented from being reduced.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A non-volatile memory device comprising:
a semiconductor substrate;
a source region and a drain region which are formed in the semiconductor substrate and doped with n-type impurities;
a trapping structure which includes a tunneling layer, which is disposed on a predetermined region of the semiconductor substrate and through which charge carriers are tunneled, and a charge trapping layer, which is formed on the tunneling layer and traps the tunneled charge carriers;
a gate insulating layer which is conformably formed on the trapping structure and the semiconductor substrate;

a gate electrode which is formed on the gate insulating layer; and a channel region which is formed between the source region and the drain region and includes a first channel region formed on a lower part of the trapping structure and a second channel region formed on a lower part of the gate insulating layer, the threshold voltage of the first channel region being lower than that of the second channel region, wherein the gate insulating layer and the gate electrode are formed on the first channel region and the second channel region.

2. The non-volatile memory device of claim 1, wherein the threshold voltage of the first channel region is lower than that of the second channel region by 1V or more.

3. The non-volatile memory device of claim 1, wherein even after an erasing operation of the charge trapping layer has been repeated a number of times, the threshold voltage of the first channel region is still lower than that of the second channel region.

4. The non-volatile memory device of claim 1, wherein the concentration of holes of the second channel region is higher than the concentration of holes of the first channel region.

5. The non-volatile memory device of claim 4, wherein the first channel region is doped with n-type impurities and the second channel region is doped with p-type impurities.

6. The non-volatile memory device of claim 4, wherein the first channel region and the second channel region are doped with p-type impurities and the second channel region is doped with the higher concentration of p-type impurities than the first channel region.

7. The non-volatile memory device of claim 1, further comprising a buffering layer between the charge trapping layer and the gate insulating layer.

8. The non-volatile memory device of claim 7, wherein the buffering layer is either an oxynitride layer or a silicon oxide ($SiO_x$) layer.

9. The non-volatile memory device of claim 1, wherein the tunneling layer is at least one of an oxynitride layer and a silicon oxide ($SiO_x$) layer.

10. The non-volatile memory device of claim 1, wherein the charge trapping layer is one or more layers each comprised of a material selected from the group consisting of silicon nitride ($SiN_x$), oxynitride, zirconium oxide ($ZrO_x$), aluminum oxide ($AlO_x$), hafnium oxide ($HfO_x$), lanthanum oxide ($LaO_x$), silicon oxide ($SiO_x$), silicon nano crystal, germanium nano crystal, and nano dot nitride, and a stack of one or more layers of these materials.

11. The non-volatile memory device of claim 1, wherein the gate insulating layer is either an oxynitride layer or a silicon oxide ($SiO_x$) layer.

12. A non-volatile memory device comprising:
a semiconductor substrate;
a source region and a drain region which are formed in the semiconductor substrate and doped with p-type impurities;
a trapping structure which includes a tunneling layer, which is disposed on a predetermined region of the semiconductor substrate and through which charge carriers are tunneled, and a charge trapping layer, which is formed on the tunneling layer and traps the tunneled charge carriers;
a gate insulating layer which is conformably formed on the trapping structure and the semiconductor substrate;
a gate electrode which is formed on the gate insulating layer; and
a channel region which is formed between the source region and the drain region and includes a first channel region formed on a lower part of the trapping structure and a second channel region formed on a lower part of the gate insulating layer, the threshold voltage of the first channel region being higher than that of the second channel region, wherein the gate insulating layer and the gate electrode are formed on the first channel region and the second channel region.

13. The non-volatile memory device of claim 12, wherein the threshold voltage of the first channel region is higher than that of the second channel region by 1V or more.

14. The non-volatile memory device of claim 12, wherein even after an erasing operation of the charge trapping layer has been repeated a number of times, the threshold voltage of the first channel region is higher than that of the second channel region.

15. The non-volatile memory device of claim 12, further comprising a buffering layer between the charge trapping layer and the gate insulating layer.

16. The non-volatile memory device of claim 12, wherein the tunneling layer is at least one of an oxynitride layer and a silicon oxide ($SiO_x$) layer.

17. The non-volatile memory device of claim 12, wherein the charge trapping layer is one or more layers each comprised of a material selected from the group consisting of silicon nitride ($SiN_x$), oxynitride, zirconium oxide ($ZrO_x$), aluminum oxide ($AlO_x$), hafuium oxide (HfOx), lanthanum oxide ($LaO_x$), silicon oxide ($SiO_x$), silicon nano crystal, gennanium nano crystal, and nano dot nitride, and a stack of one or more layers of these materials.

18. The non-volatile memory device of claim 12, wherein the gate insulating layer is either an oxynitride layer or a silicon oxide ($SiO_x$) layer.

19. A non-volatile memory device comprising:
a semiconductor substrate;
a source region and a drain region which are formed in the semiconductor substrate and doped with n-type impurities;
a trapping structure which includes a tunneling layer, which is disposed on a predetermined region of the semiconductor substrate and through which charge carriers are tunneled, and a charge trapping layer, which is formed on the tunneling layer and traps the tunneled charge carriers;
a gate insulating layer which is conformably formed on the trapping structure and the semiconductor substrate;
a gate electrode which is formed on the gate insulating layer;
a channel region, which is formed between the source region and the drain region when a threshold voltage is applied to the gate electrode, and includes a first channel region on a lower part of the trapping structure and a second channel region on a lower part of the gate insulating layer, wherein the gate insulating layer and the gate electrode are formed on the first channel region and the second channel region;
a first doping region which is formed at a predetermined location in the first channel region; and
a second doping region which is formed at a predetermined location in the second channel region, the threshold voltage of the first doping region being lower than that of the second doping region.

20. The non-volatile memory device of claim 19, wherein the threshold voltage of the first doping region is lower than that of the second doping region by 1V or more.

21. The non-volatile memory device of claim 19, wherein even after an erasing operation of the charge trapping layer has been repeated a number of times, the threshold voltage of the first doping region is still lower than that of the second doping region.

22. The non-volatile memory device of claim 19, wherein the concentration of holes of the second doping region is higher than the concentration of holes of the first doping region.

23. The non-volatile memory device of claim 22, wherein the first doping region is doped with n-type impurities and the second doping region is doped with p-type impurities.

24. The non-volatile memory device of claim 22, wherein the first doping region and the second doping region are doped with p-type impurities and the second doping region is doped with the higher concentration of p-type impurities than the first doping region.

25. The non-volatile memory device of claim 19, further comprising a buffering layer between the charge trapping layer and the gate insulating layer.

26. The non-volatile memory device of claim 19, wherein the tunneling layer is at least one of an oxynitride layer and a silicon oxide ($SiO_x$) layer.

27. The non-volatile memory device of claim 19, wherein the charge trapping layer is one or more layers each comprised of a material selected from the group consisting of silicon nitride ($SiN_x$), oxynitride, zirconium oxide ($ZrO_x$), aluminum oxide ($AlO_x$), hafnium oxide ($HfO_x$), lanthanum oxide ($LaO_x$), silicon oxide ($SiO_x$), silicon nano crystal, germanium nano crystal, and nano dot nitride, and a stack of one or more layers of these materials.

28. The non-volatile memory device of claim 19, wherein the gate insulating layer is either an oxynitride layer or a silicon oxide ($SiO_x$) layer.

* * * * *

UNITED STATES PATENT AND TRADEMARK OFFICE
CERTIFICATE OF CORRECTION

PATENT NO. : 7,586,137 B2
APPLICATION NO. : 11/200491
DATED : September 8, 2009
INVENTOR(S) : Ki-chul Kim et al.

It is certified that error appears in the above-identified patent and that said Letters Patent is hereby corrected as shown below:

Column 18, line 26, delete "hafuium oxide (HfOx)" and insert --hafnium oxide ($HfO_x$)--

Column 18, lines 27-28, delete "gennanium" and insert --germanium--

Signed and Sealed this

Eighth Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,586,137 B2
APPLICATION NO. : 11/200491
DATED : September 8, 2009
INVENTOR(S) : Kim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 516 days.

Signed and Sealed this

Fourteenth Day of September, 2010

David J. Kappos
*Director of the United States Patent and Trademark Office*